(12) United States Patent
Poelker et al.

(10) Patent No.: US 11,056,313 B1
(45) Date of Patent: Jul. 6, 2021

(54) WIEN FILTER WITH INTEGRATED VACUUM PUMP

(71) Applicant: JEFFERSON SCIENCE ASSOCIATES, LLC, Newport News, VA (US)

(72) Inventors: Bernard Matthew Poelker, Yorktown, VA (US); Gabriel Gerardo Palacios Serrano, Yorktown, VA (US); Carlos Hernandez Garcia, Yorktown, VA (US)

(73) Assignee: jefferson science associates, llc, Newport News, VA (US)

( * ) Notice: Subject to any disclaimer, the term of this patent is extended or adjusted under 35 U.S.C. 154(b) by 0 days.

(21) Appl. No.: 16/904,910

(22) Filed: Jun. 18, 2020

(51) Int. Cl.
*H01J 37/18* (2006.01)
*H01J 37/05* (2006.01)

(52) U.S. Cl.
CPC ............. *H01J 37/18* (2013.01); *H01J 37/05* (2013.01); *H01J 2237/057* (2013.01)

(58) Field of Classification Search
CPC ....... H01J 37/18; H01J 37/05; H01J 2237/057
USPC ............................... 250/305, 396 R, 396 ML
See application file for complete search history.

(56) References Cited

U.S. PATENT DOCUMENTS

| | | | |
|---|---|---|---|
| 2,450,602 | A | 10/1948 | Levialdi |
| 5,871,336 | A | 2/1999 | Young |
| 8,421,029 | B1 | 4/2013 | Ren et al. |
| 8,835,866 | B2 | 9/2014 | McGinn |
| 9,960,026 | B1 * | 5/2018 | Hughes .................. H01J 41/14 |

* cited by examiner

*Primary Examiner* — Michael Maskell

(57) ABSTRACT

An integral Wien filter and vacuum pump for separating charged particles or for orienting their spin direction while maintaining optimal beamline vacuum. The vacuum pump is an ion pump including one or more cylindrical Penning cells to trap and expel electrons. The Wien filter includes orthogonal electric and magnetic fields to direct particles with the desired speed through the device while deflecting particles at undesired speeds. The Wien filter includes two electrodes, one biased positive and one biased negative, a dipole magnet, and means for reversing polarity of the electrodes to flip the spin of the charged particles. Metal plates on either side of the Penning cells embed gas that is ionized by trapped electrons in the Penning cell thus creating vacuum by turning gas into solid. The two metal plates can be configured to obtain vacuum pumping via chemical gettering and for removal of noble gases.

6 Claims, 3 Drawing Sheets

WIEN FILTER WITH INTEGRATED VACUUM PUMP

The United States Government may have certain rights to this invention under Management and Operating Contract No. DE-AC05-06OR23177 from the Department of Energy.

FIELD OF THE INVENTION

The present invention relates to vacuum systems and more particularly to a combination filtration and vacuum system for enhancing the vacuum quality and reducing residual gas ions in a high vacuum environment.

BACKGROUND

A conventional Wien filter is a common device composed of orthogonal electric and magnetic fields, such that particles with the correct speed will travel through the device unaffected while other particles will be deflected. Conventional Wien filters typically include two electrodes, including one biased positive and one biased negative, and a dipole magnet. Wien filters can be used as a velocity filter or as a selector for charged particles, for example in electron microscopes and spectrometers. And because charged particles travel at different speeds depending on their mass, Wien filters are also used as mass selectors. At the Continuous Beam Accelerator Facility (CEBAF), in Newport News, Va., Wien filters are used to orient the spin direction of the polarized electron beam delivered to experiment halls.

Conventional ion pumps are used with charged particle accelerators to remove various gas atoms and molecules in order to maintain the optimal beamline vacuum. Ion pumps are commonly called "capture pumps" because they turn gas into solid that mostly never comes back out. This is true for most gases, with the exception of noble gases like argon if only titanium plates are used. If an ion pump is energized in the presence of lots of argon, krypton, or helium, these gases will "burp out" until the end of time.

The beam path at charged particle accelerators, such as the superconducting radio frequency (SRF) cavities at CEBAF, must be maintained at a high vacuum, typically less than $10^{-9}$ Torr, in order to properly accelerate the beam. Unfortunately, from a vacuum perspective, Wien filters negatively affect the vacuum as a consequence of the large surface area within the filter, i.e. Pressure=(Outgassing Rate×Surface Area)/Pump Speed. The materials used to build the Wien filter can be treated to reduce Outgassing Rate, but Surface Area is large and Pump Speed is only what is provided through the small holes in the nickel plate field clamps. So the large surface area in the numerator and the small pump speed in the denominator means high pressure inside the Wien filter, which is a bad situation for a polarized photoinjector. Even with treatment of the materials within the Wien filter, the small holes in the nickel plates are still limited to approximately 2 L/s (liters/second) pump speed.

Accordingly, it would be advantageous to combine the features of a Wien filter with one or more Penning cells to provide a high vacuum pump speed and thereby assist in maintaining the high vacuum required in the beamline.

This invention disclosure describes adding features of the ion pump to a Wien filter, to provide all the functionality of a Wien filter but also serving as a vacuum pump, which can be very beneficial for accelerator applications. Specifically, it will improve the vacuum near the photogun, and thereby improve the operating lifetime of the photogun.

OBJECTS AND ADVANTAGES OF THE INVENTION

The object of the present invention is to provide a combined pumping and filtration device for improving the quality of the vacuum in the beamline of a particle accelerator.

A further object of the invention is to improve the beamline vacuum near the spin polarized electron gun at the Continuous Beam Accelerator Facility (CEBAF), in Newport News, Va.

A further object of the invention is to improve the operating lifetime of the photoguns in particle accelerator facilities, and, by minimizing the frequency of heating and reactivating the photocathode, will reduce downtime of the accelerator.

In particle accelerators, adding "distributed pumping" is advantageous. Distributed pumping involves adding pumping along the entire beamline, and not just at specific locations separated by a long distance, with big variations in pressure along the way. At light sources, distributed pumping was accomplished using chemical getter pumps, turning the interior surface of the beampipe into a vacuum pump. The dual-functionality Wien filter/vacuum pump of the current invention provides enhanced distributed pumping that will reduce the pressure variation along the beampipe.

Another object of the invention is to provide a device that combines features of the Wien filter and the ion pump to provide dual functionality and eliminate the need for separate filters and pumps.

Yet another object of the invention is to provide a Wien filter integral with one or more Penning cells to provide a pump speed of at least 30 L/s.

These and other objects and advantages of the present invention will be understood by reading the following description along with reference to the drawings.

SUMMARY OF THE INVENTION

The present invention is an integral Wien filter and vacuum pump device for use in particle accelerator systems. While the Wien filter is used to orient the spin direction of a polarized electron beam or to separate charged particles that travel at different speeds depending on their mass, the vacuum pump maintains optimal beamline vacuum by removing various gas atoms and molecules. The vacuum pump is an ion pump including one or more cylindrical Penning cells to trap and expel electrons. The Wien filter includes orthogonal electric and magnetic fields to direct particles with the desired speed through the device while deflecting particles at undesired speeds. The Wien filter includes two electrodes, including one biased positive and one biased negative, a dipole magnet, and means for reversing polarity of the electrodes to flip the spin of the charged particles as desired. Metal plates on opposing sides of the Penning cells embed gas that is ionized by trapped electrons in the Penning cell thus creating vacuum by turning gas into solid. The two metal plates can each be constructed of titanium to obtain vacuum pumping via chemical gettering or one constructed of titanium and one of tantalum to obtain removal of noble gases.

BRIEF DESCRIPTION OF THE SEVERAL VIEWS OF THE DRAWING(S)

Reference is made herein to the accompanying drawings, which are not necessarily drawn to scale, and wherein.

DETAILED DESCRIPTION

Figure 1:
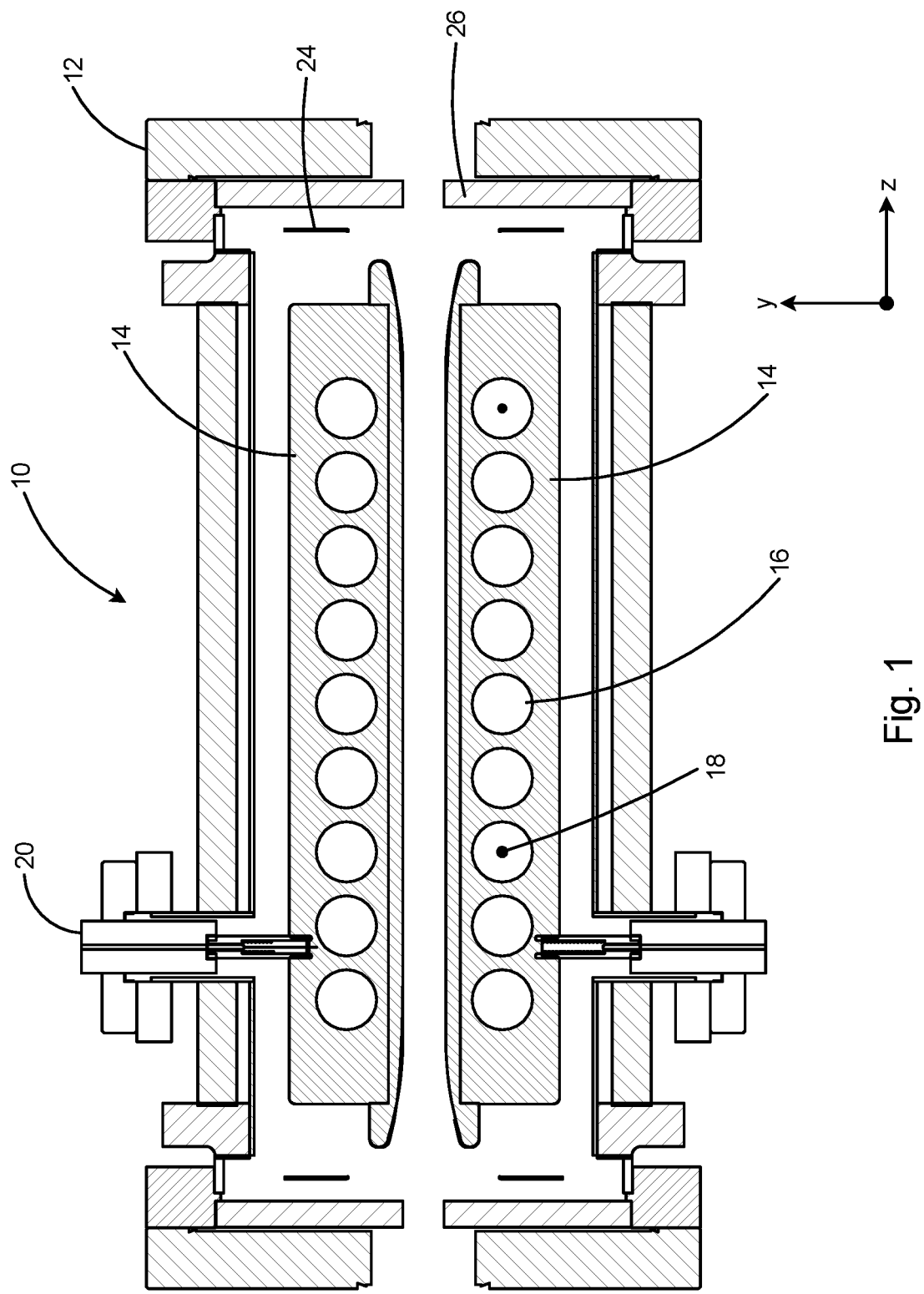
FIG. 1 is a lateral cross-sectional view of a Wien filter and integrated vacuum pump according to the present invention. A magnetic field (not shown) fills the vacuum chamber and points out of the plane.

The present invention is a combined vacuum pump and filtration device for improving the quality of the vacuum in the beamline of a particle accelerator. The combined vacuum pump and filter will enhance the distributed pumping and reduce the pressure variation along the beampipe of a particle accelerator thereby improving the operation of the accelerator.

Ion pumps are vacuum pumps composed of cylindrical Penning cells through which a magnetic field is applied parallel to the axis of the Penning cell. On either side of the Penning cell are metal plates. Gas that is ionized by trapped electrons in the Penning cell are expelled, and embedded in the metal plates, creating vacuum by turning gas into solid. If one or both of the metal plates is made of titanium, additional vacuum pumping is obtained via chemical "gettering". Hydrogen ions that strike the titanium are turned into solid as a result of chemical reaction with the titanium.

Wien filters serve as "mass selectors" and "spin manipulators". For both applications, charged particles (ions for mass selectors, electrons for spin manipulators) pass through the filter device with "crossed E and B fields". Crossed means the electric field and the magnetic field are orthogonal to each other, i.e., 90 degree angle between their directions. The force from an electric field on the charged particle is the product qE where q is the charge of the particle, and E is the magnitude of the electric field. The force from a magnetic field is q (v×B), where q is once again, the charge of the particle (for electron, q=−1), and v is the speed of the particle. The "x" sign denotes "cross product". Because of this cross product, E and B fields with 90 degree angle between their directions produce forces that oppose one another, i.e., 180 degrees between the forces.

For a spin manipulator application, the B field rotates the direction of the spin, but it also steers the beam. To have the electrons enter and come out of the Wien in the right direction, the E field is added to restore the electron beam trajectory to "straight". This happens when the B field force is equal in magnitude to the E field force, but pointing in opposite directions. Summary: the B field rotates the polarization direction, and the two forces cancel such that a straight trajectory is maintained.

For the mass selector application, imagine ions of different species, i.e., masses, entering the Wien filter. Light ions are moving faster than heavy ions, i.e., the mass of the ion determines its speed. As an example, a Wien filter mass selector can be used to separate deuterium molecules (mass 4) from hydrogen molecules (mass 2). Because of the velocity term in the B field force, only ions of specific velocity will pass through the Wien undeflected, corresponding to the velocity that results in equal but opposite E and B field forces.

A Wien filter is composed of a vacuum chamber, two electrodes biased with opposite polarity, high voltage vacuum feedthroughs, ceramic insulators to electrically isolate the electrodes from ground, an electromagnet composed of coil and steel to enhance field and magnet return yoke, and for us we use magnet field clamps (nickel plates) to turn OFF the B field in the z-direction on both sides of the Wien, entrance and exit.

A Wien filter according to the invention will have E and B fields with a profile in the Z direction that perfectly match each other. This is hard to do and, in conventional Wien filters there is usually a mismatch at the front and back ends. This results in electrons/ions suffering a small deflection, sometimes termed a "mini chicane", at the front end and back end of the device.

According to the invention, a method for forming a combined pumping and filtration device includes the steps of: 1) designing a magnet, such as with the TOSCA magnet design tool; 2) fabricating the magnets; 3) mapping the magnetic field of the magnets, such as using a Hall probe, to obtain the z-direction profile of the magnets; and 4) creating electrode shapes that provide a perfect match of the B field, such as with an electrostatic modeling tool (POISSON).

In the present invention, the ion pump configuration is preferably either a conventional diode ion pump including two titanium plates, or a differential ion pump "DI" including one titanium plate and one tantalum plate. The tantalum plate pumps the noble gases. Differential describes an ion pump with two plates on either side of the Penning cell, composed of different material. In our case Titanium and Tantalum. So, for the current invention, the Wien filter can be configured as "conventional diode" or "differential ion", by simply using two titanium plates or, one titanium plate and one tantalum plate, respectively.

Titanium is an excellent chemical getter material, great for pumping $N_2$, $O_2$, $H_2$, CO, $CO_2$, water vapor, and light hydrocarbons. Also pretty good for other species that penetrate into the titanium and become trapped, but as mentioned above, can "burp out" over time, thus creating pump instability.

Tantalum is an extremely hard, high atomic mass material. As such, it reflects noble gas ions as neutral particles with much higher energy than titanium. This gives much higher implantation depth in the electrodes and physisorption (trapping). Less burping, better stability.

Penning cells are the place where electrons are trapped and traveling in tight helical spirals trajectories. They hit residual gas that wanders into them. Once ionized, the ions are repelled from the Penning cell which is biased with positive voltage typically anywhere from 3 to 10 kV. The positive ion is pushed out of the positively biased Penning cell toward the titanium or tantalum plates. For the ions pushed to the titanium plate, they will sputter titanium atoms onto the Penning cell surface (and onto the tantalum plate, and everywhere else) which acts as a chemical getter pump. The titanium plate itself serves as a getter surface too, and some ions are captured, embedded in the plate. For ions directed toward the tantalum plate, they simply become embedded.

In a preferred embodiment according to the invention, only one electrode will be biased positive, so pumping only happens at that electrode. For the electrode biased negative, there's no pumping because electrons are not trapped inside the Penning cells, and therefore there's no ionization happening. It will depend on the spin setting we choose as to which electrode is pumping. For positive Wien angles, it will be electrode #1. For negative Wien angles, it will be electrode #2.

At CEBAF, the voltage on the electrodes is set to obtain the desired spin rotation. Wien spin settings require voltage in the range 3 to 10 kV provide an excellent pumping rate.

A filter with integrated vacuum pump according to the invention can include a conventional ion pump using two titanium plates, or a DI, noble gas pump using the titanium/tantalum combination. It is expected that a combined filter with integrated vacuum pump according to the invention will improve the pressure inside the Wien by more than an order of magnitude. It is believed that combining a Wien filter with one or more Penning cells will easily provide at least 30 L/s pump speed. There is no requirement for where the titanium and tantalum plates are configured relative the Penning cell electrode.

With reference to FIG. 1, a combined vacuum pump and filtration device 10 according to the invention includes a vacuum chamber 12 and two high voltage electrodes 14 with one or more Penning traps 16 in each electrode. The Penning traps 16 are preferably cylindrical holes formed in the electrodes, with cylinder axes 18, one of which is shown, oriented parallel to the magnetic field produced by the Wien dipole magnet. A high voltage vacuum feedthrough 20 provides positive and negative charge to the high voltage electrodes 14. The positive-biased electrodes 14 will provide pumping of positive ions. Ceramic insulators 24 electrically isolate the electrodes 14 from ground and magnet field clamps 26, which are nickel plates used to turn OFF the B field in the z-direction on both sides of the Wien entrance and exit. An electromagnet (not shown) composed of coil and steel are included to enhance field and magnet return yoke. A magnetic field (not shown) fills the vacuum chamber and points out of the plane.

Figure 2:
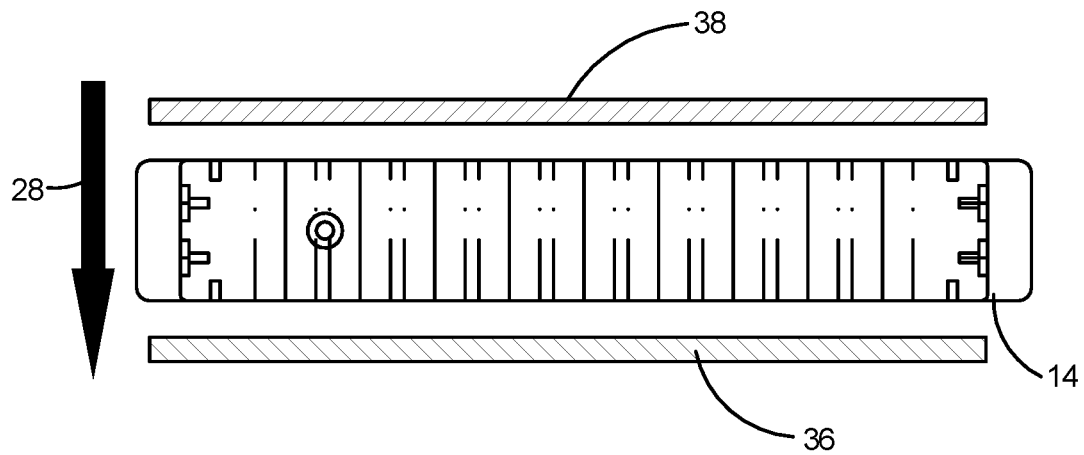
FIG. 2 is a top view of a high voltage electrode with Penning traps, the titanium and tantalum plates that form a portion of the Wien filter of FIG. 1. A magnetic field fills the gap between the titanium and tantalum plates and points in the direction indicated by the solid arrow.
Figure 3:
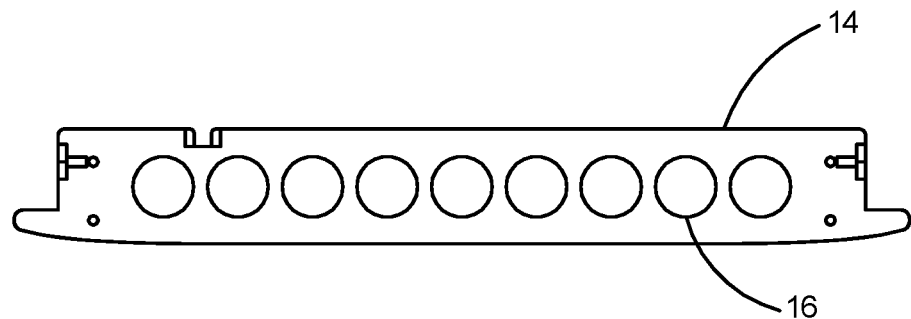
FIG. 3 is a side view of the high voltage electrode with Penning traps.
Figure 4:
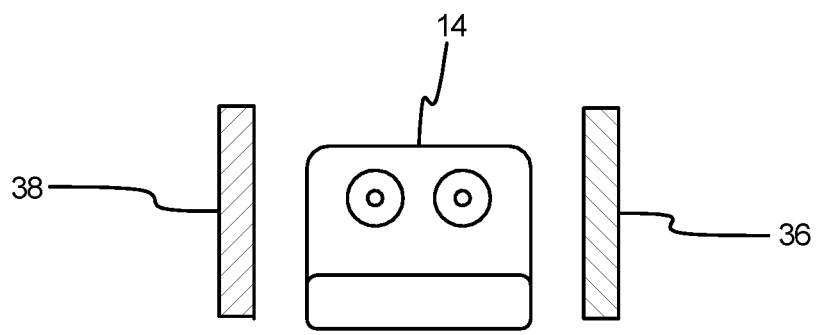
FIG. 4 is an end view of the high voltage electrode with Penning traps, the titanium and tantalum plates. A magnetic field fills the gap between the titanium and tantalum plates and points in the direction indicated by the solid arrow.

Referring to FIGS. 2 and 3, the preferred embodiment of a combined vacuum pump and filtration device configured as a "differential ion" pump, by using one titanium plate 36 and one tantalum plate 38 on opposite sides of the electrode 14. A magnetic field fills the gap between the titanium and tantalum plates and points in the direction indicated by the solid arrow 40. The positive ions produced inside the positively biased Wien electrode will be expelled and embedded in the titanium plate 36. Frequently the polarity of the Wien filter electrodes is reversed, to flip the spin of the polarization at the experiment halls. When this happens, the other plate will become the vacuum ion pump. Alternatively, the vacuum pump and filtration device configured as a conventional diode ion pump having two titanium plates.

Figure 5:
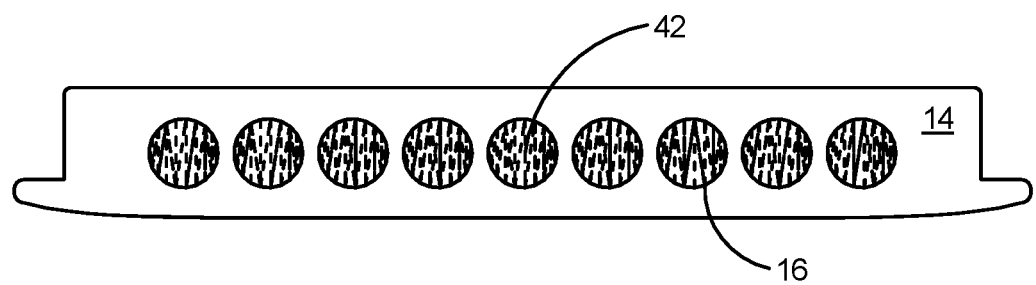
FIG. 5 is a side view of the high voltage electrode depicting trajectories of simulated particles in the Penning traps.
Figure 6:
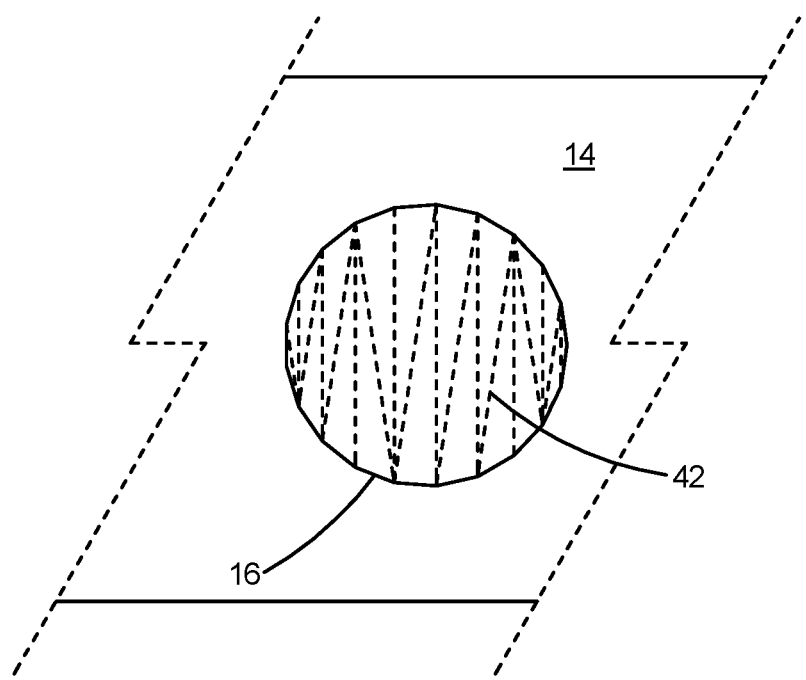
FIG. 6 is a detail view of one Penning trap depicting the particle trajectories of simulated particles.

With reference to FIGS. 5 and 6, simulated particles in the Penning traps 16 of the high voltage electrode 14 will have tight helical spirals trajectories 42 as shown. The Penning trap operates at maximum voltage+20 kV per plate and with corresponding maximum magnetic field of up to 0.0130 T (Tesla). The Penning cells 16 trap the electrons and the electrons in the trap hit residual gas that wanders into them. Once ionized, the ions are repelled from the Penning cell, with the best pumping performance obtained for positive voltage typically anywhere from 3 to 10 kV. The positive ion is pushed out of the positively biased Penning cell toward the titanium or tantalum plates. The ions pushed to the titanium plate acts as a chemical getter pump and sputters titanium atoms onto the Penning cell surface onto the tantalum plate and other interior surfaces. Additionally, some ions are captured and embedded in the titanium plate. For ions directed toward the tantalum plate, they simply become embedded.

The pump speed of the device will depend on the settings of the Wien filter, which change depending on the beam energy requirements of the specific application. According to the invention, the pump speed will be proportioned to fit the specific electric and magnetic fields of the specific application.

Potential applications of this technology include particle accelerators and electron microscopes, nuclear reactors, clean room particle analysis, and any manufacturing process that requires a vacuum, such as integrated circuit production.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A filter with integrated vacuum pump, comprising:
    a Wien filter to orient the spin direction of a polarized electron beam;
    an ion pump including a pair of electrodes, said electrodes including one or more cylindrical Penning cells to trap and expel electrons;
    a means to apply a magnetic field parallel to the axes of each of the Penning cells to trap and expel electrons trapped in the Penning cells;
    a means to apply an electric field to the Wien filter; and
    metal plates on opposing sides of the Penning cells, the metal plates to embed gas ionized by trapped electrons in the Penning cells and create vacuum by turning gas into solid.

2. The filter with integrated vacuum pump of claim 1, comprising at least one of said metal plates is constructed of titanium to provide vacuum pumping via chemical gettering.

3. The filter with integrated vacuum pump of claim 2, comprising a second of said metal plates is a material selected from the group consisting of titanium and tantalum.

4. The filter with integrated vacuum pump of claim 1, comprising:
    a first of said metal plates is constructed of titanium to provide additional vacuum pumping via chemical gettering; and
    a second of said metal plates is constructed of tantalum to provide pumping of noble gases.

5. The filter with integrated vacuum pump of claim 1, wherein the Penning cells comprise a pump speed of at least 30 liters/second.

6. The filter with integrated vacuum pump of claim 1, wherein the Penning cells provide optimized pumping when biased with positive voltage from 3 to 10 kV.

* * * * *